United States Patent
Hogan

(10) Patent No.: US 7,687,725 B2
(45) Date of Patent: Mar. 30, 2010

(54) CORROSION RESISTANT FARADAY CAGE ELECTRONIC ENCLOSURE ASSEMBLY

(75) Inventor: Michael P. Hogan, Carmel, IN (US)

(73) Assignee: Delphi Technologies, Inc., Troy, MI (US)

(*) Notice: Subject to any disclaimer, the term of this patent is extended or adjusted under 35 U.S.C. 154(b) by 56 days.

(21) Appl. No.: 12/009,411

(22) Filed: Jan. 18, 2008

(65) Prior Publication Data

US 2009/0183912 A1    Jul. 23, 2009

(51) Int. Cl.
*H01R 4/48* (2006.01)

(52) U.S. Cl. .................. 174/367; 174/377; 174/382

(58) Field of Classification Search .......... 174/367, 174/368, 358, 355, 369, 377, 382; 361/816, 361/818, 800
See application file for complete search history.

(56) References Cited

U.S. PATENT DOCUMENTS

| | | | |
|---|---|---|---|
| 4,567,318 A * | 1/1986 | Shu ............................ 174/372 |
| 5,001,298 A * | 3/1991 | Jong .......................... 174/372 |
| 5,095,177 A * | 3/1992 | Johnson ...................... 174/372 |
| 6,348,654 B1 * | 2/2002 | Zhang et al. ................ 174/362 |
| 6,549,426 B1 * | 4/2003 | Lawlyes et al. ............. 361/816 |
| 2002/0185292 A1 * | 12/2002 | Ariel ...................... 174/35 GC |
| 2008/0158851 A1 * | 7/2008 | Cochrane .................... 361/818 |

\* cited by examiner

*Primary Examiner*—Hung V Ngo
(74) *Attorney, Agent, or Firm*—Jimmy L. Funke

(57) ABSTRACT

A corrosion resistant Faraday cage assembly includes an electrically conductive cover and a coated die cast housing having a ledge extending around the perimeter of the housing. A fence is positioned adjacent to the ledge and a track is positioned between the ledge and the fence. A plurality of serrated contact points are positioned on the fence and are used for making electrical contact with the electrically conductive cover extending over the track. The contact points are either masked prior to the protective coating process or they are mechanically or chemically modified afterward to expose a plurality of electrically-conductive surfaces to be in contact with the electrically-conductive cover.

17 Claims, 1 Drawing Sheet

CORROSION RESISTANT FARADAY CAGE ELECTRONIC ENCLOSURE ASSEMBLY

FIELD OF THE INVENTION

The present invention pertains to shielding of electromagnetic emissions and interference and more particularly to an integrated Faraday cage for use in vehicular applications.

BACKGROUND OF THE INVENTION

Electronic Control Modules (ECMs) are now commonplace in under-hood vehicular applications and are used to provide computer control of various functions of the vehicle. The ECM enclosure or housing provides a number of functions including: (1) conducting thermal power away from the electronics to the environment; (2) protecting the electronics from environmental elements; and (3) providing a shield to minimize electromagnetic energy from entering or exiting the ECM. This invention leverages the state-of-the-art approaches to address each of these functions and integrates them into one design approach.

Current designs typically use die-cast aluminum material for the housing or enclosure. Die-cast aluminum is a cost-effective approach to provide part geometry and material properties to efficiently pull thermal power away from the electronics and transfer that heat to the larger environment. Unfortunately, these materials are susceptible to corrosion and/or deterioration over time. Additionally, The automotive industry continues to require ECM products to have higher reliability and endure a harsh environment for greater durations than used in prior vehicular applications. Consequently, corrosion resistance requirements for ECMs have increased significantly in recent years. The state-of-the-art has evolved to address this issue through the use of environmental coatings such as powder coats, epoxy electrostatic coatings, and anodizes, to protect the ECM enclosure from weather and a corrosive environment.

Electromagnetic Compatibility (EMC) requirements such as radiated radio frequency (RF) emissions and electromagnetic interference (EMI) susceptibility have also become more stringent during this time frame. Additionally, increased microprocessor speeds, proliferation of communication buses, faster data transfer rates, and use of expanded memory modes have also become more prevalent thus generating more electromagnetic energy at higher frequencies. One solution to mitigate these issues is to create a Faraday cage around the circuit board assembly using the structure of the ECM. This cage is created by having continuous or closely spaced contact points between the ECM housing and the aluminum cover that covers, seals, and/or protects the module. This design approach requires electrical conductivity between the top half and the bottom half of the enclosure. Unfortunately, the environmental coatings discussed in the previous paragraph are typically electrically-insulating materials. Thus, the requirements to provide a protective coating and provide an electromagnetic shield, all in an integrated housing, are mutually exclusive with the current design approaches.

There are two methods to circumvent this problem. The first is to apply a protective spray to the completely assembled ECM in order to seal it from the environment. Unfortunately, the processes involved in coating the ECM after assembly can damage the electronics inside the assembly. The second approach that has been used in the past is for the assembly screws to electrically connect the top half and bottom half of the enclosure for creating the integrated Faraday cage. However, new design guidelines, based on high frequency operation, call for these connections to be less than 0.5 inches (12.7 mm) apart. This quantity of screws is neither cost-effective nor practical in many applications.

SUMMARY OF THE INVENTION

A corrosion resistant Faraday cage assembly includes an electrically conductive, yet corrosion-resistant, cover used in connection with a die cast housing using a protective, corrosion-resistant coating. A ledge extends about the perimeter of the housing. An adhesive track, that ultimately provides the environmental seal, is positioned along the outside perimeter of the housing. A fence is integrated into the ledge but inboard of the adhesive track where one or more serrated contact points may be placed or integrated with the fence for making electrical contact with the cover. An embodiment of the present invention leverages the benefits of the corrosion-resistant coatings and to provide a robust environmental seal design for a Faraday cage for managing electromagnetic energy emissions and/or interference prevalent in the use of electronic components. If the contact points are coated or become covered with corrosion, the electrical conductivity will decrease sufficiently to render the effect of the Faraday cage insufficient.

These and other features, advantages, and objects of the present invention will be further understood and appreciated by those skilled in the art by reference to the following specifications, claims, and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
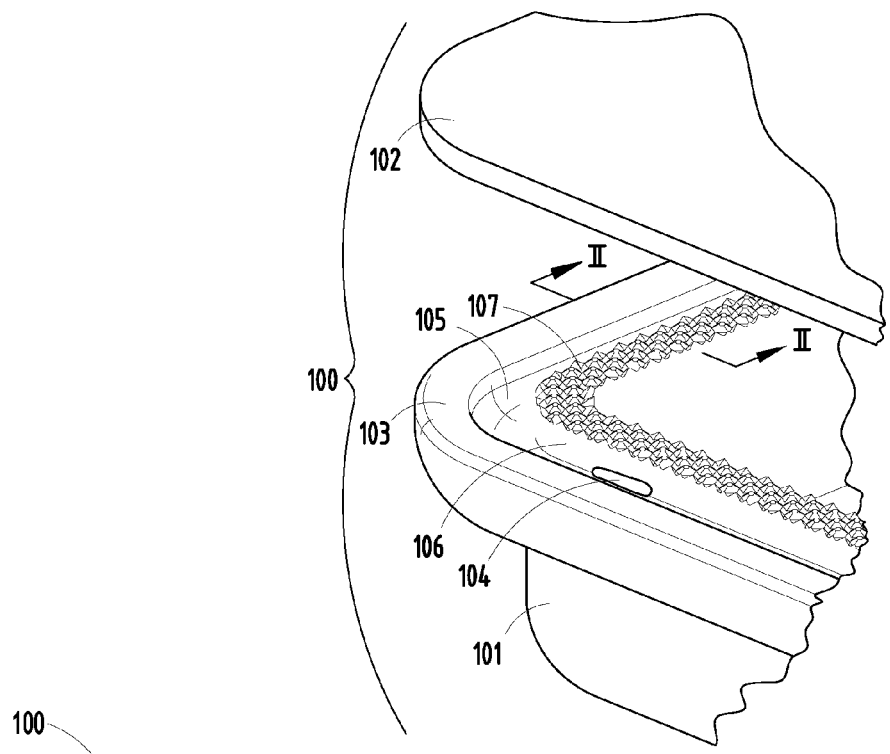
FIG. 1 is an isometric view of the Faraday cage electronic enclosure in accordance with an embodiment of the invention.

Before describing in detail embodiments that are in accordance with the present invention, it should be observed that the embodiments reside primarily in combinations of method steps and apparatus components related to a Faraday cage electronic enclosure. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

FIG. 1 is an isometric view of the Faraday cage electronic enclosure 100 in accordance with an embodiment of the invention. The enclosure includes a die cast housing 101 that is coated and/or plated with a protective covering material to prevent crossing and deterioration due to its exposure to the elements. A cover ledge 103 holds a cover 102 down in a fixed position while an adhesive track 105 is used to hold an adhesive or sticky-like material 104 within the channel or track 105. The adhesive material 104 is used to provide an added mechanical bond between the cover 102 and the die cast housing 101.

Included within an inner wall of the die cast housing 101 is a fence 106 and a plurality of serrated contact points 107 for providing electrical contact between the cover and the die cast housing 101. The serrated contact points 107 sit atop or are integrated with the fence 106 and make electrical contact between the enclosure 101 and a cover as described herein. As will be evident to those skilled in the art, the serrated contact points 107 may be positioned on the fence 106 in a periodic fashion depending on the operational frequency of an electrical components within the enclosure 100. Within the enclosure 100 is a void or space which allows for one or more circuit boards and/or electronic devices (not shown) to be electrically shielded from the outside environment in order to prevent interference by EMI or the escape of RF radiation from the housing 101.

Figure 2:
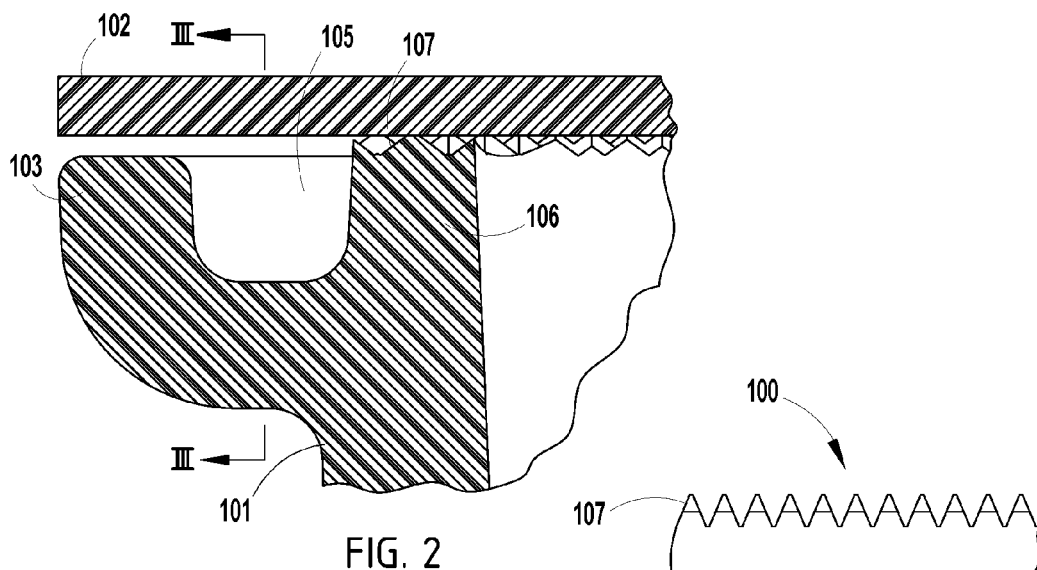
FIG. 2 is a magnified side cross-sectional view of the electronic enclosure through lines II-II shown in FIG. 1.

FIG. 2 is a magnified side cross-sectional view of the electronic enclosure assembly 100 through lines II-II shown in FIG. 1. A top or cover 102 is used to cover the housing 101. The cover 102 extends over the ledge 103 such that it is substantially flush therewith. The channel or adhesive track 105 is shown substantially square in cross section and is used to hold the cover 102 into a fixed position with adhesive and/or sealant material (not shown) that is located in the adhesive track 105. One or more serrated contact points 107 are positioned and/or integrated with a fence 106. Each serrated contact point 107 is used to make electrical contact with the cover 102 enabling electrical continuity between the top 102 and housing 101. This forms an RF seal with an interior portion of the enclosure against EMI and/or the escape of RF energy that may be generated therein.

Figure 3:
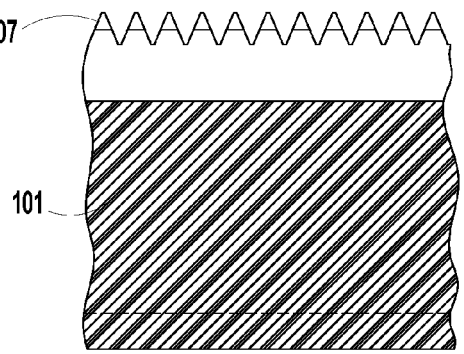
FIG. 3 is a magnified cross-sectional view of the electronic enclosure though lines III-III shown in FIG. 2.

FIG. 3 is a magnified cross-sectional view of the electronic enclosure 100 though lines III-III shown in FIG. 2. This magnified view illustrates the die cast housing 101 which includes a plurality of serrated contact points 107 that extend along the top side of the die cast housing 101. Although shown spaced in a periodic manner, it should be evident that these edges can be randomly spaced or oriented in any custom manner in order to provide an optimal and most effective RF shield between a top (not shown) and the side of die cast housing 101. Each of the contact points 107 operates as serrated teeth forming a substantially conical, truncated shape. Each contact point may be either mechanically or chemically reduced in order to expose the bare metal casting material beneath its plating. In normal use, an uncoated corrosion-resistant cover will be manufactured of sheet metal stock and is installed over the top of the contact points 107.

Thus, an embodiment of the present invention uses a corrosion-resistant sheet alloy, such as ASM 5052 or the like, for manufacturing a cover material which does not use any type of a non-conductive coating. A plurality of serrated contact points are cast in a track of contact points about the perimeter of the housing. This creates a surface upon which the cover will rest. A sealant is used in the adhesive track for environmentally protecting the teeth. The die cast housing is fully coated with a corrosion-resistant coating thus allowing for the use of alloys that may not be highly corrosion-resistant. These alloys are generally less expensive, easier to cast and machine. Material is either mechanically or chemically removed from the tips of the contact points to expose the electrically-conductive material beneath the coating. A cover is assembled to the casting using screws or other mechanical fastening means that can provide a clamping force. A slight "interference fit" against the contact points will typically be present in order to establish a preloaded condition in order to retain contact pressure.

These embodiments of the invention provide a number of distinct advantages in that the electrical connections between the housing and the cover are contained in the environmentally-sealed interior of the ECM. The cover can be made from corrosion-resistant material because it is a sheet product and not a casting alloy. Moreover, there is no need to incur additional expenses for coating the cover allowing its surface to remain electrically conductive. The housing can be coated in a normal, robust method of full immersion rather than through a spray application process. The contact surface of the housing does not need to be masked while the use of serrated contact points necessitates very little material removal as compared to a flat surface. The distance between serrated teeth and the contact between the cover and the housing can be optimized to address specific ECM issues, such as requirement deviations at specific operational frequencies of devices placed within the shield.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A corrosion resistant radio frequency (RF) cage assembly comprising:
    an electrically conductive cover;
    a coated die cast housing having a ledge extending around the perimeter of the housing and an integrally cast fence positioned adjacent to the ledge with a track defined between the ledge and the fence, with a plurality of integrally cast serrated contact points defined on the surface of the fence facing the cover for making electrical contact with the electrically conductive cover extending over the track.

2. A corrosion resistant RF cage assembly as in claim 1, wherein the coating is absent from the contact points in locations where the contact points make electrical contact with the cover.

3. A corrosion resistant RF cage assembly as in claim 1, wherein the track is filled with an adhesive material for holding the cover into a fixed position.

4. A corrosion resistant RF cage assembly as in claim 3, wherein the adhesive material provides an environmental seal for protecting the contact points from corrosion.

5. A corrosion resistant RF cage assembly as in claim 1, wherein the plurality of serrated contact points are positioned in a periodic manner on the fence.

6. A Faraday cage shielding assembly comprising:
    an electrically conductive cover;
    a corrosion resistant die cast housing including an integrally cast fence having a plurality of serrated contact points extending about the perimeter of the die cast housing and a cover ledge extending from the die cast housing for fastening the cover to the die cast housing into a fixed position with an adhesive track defined between the fence and cover ledge for holding an adhesive for securely holding the cover; and wherein the serrated contact points are electrically conductive for making contact with the cover for providing a radio frequency (RF) seal for components within the shielding assembly.

7. A Faraday cage shielding assembly as in claim 6, wherein the coating is absent from the contact points in locations where the contact points make electrical contact with the cover.

8. A Faraday cage shielding assembly as in claim 6, wherein the serrated contact points are substantially truncated.

9. A Faraday cage shielding assembly as in claim 6, wherein the cover extends such that it is approximately flush with an edge of the cover ledge.

10. A Faraday cage shielding assembly as in claim 6, wherein the serrated contact points are positioned at predetermined distances from one another.

11. A method for assembling a corrosion resistant Faraday cage comprising the steps of:
providing an electrically conductive cover; and
forming a coated die cast housing having a ledge extending around the perimeter of the housing and an integrally cast fence positioned adjacent to the ledge with a track defined between the ledge and the fence and a plurality of integrally cast serrated contact points on the fence for making electrical contact with the electrically conductive cover extending over the track.

12. A method for assembling a corrosion resistant Faraday cage as in claim 11, further comprising the step of:
eliminating the coating from the contact points in locations where the contact points make electrical contact with the cover.

13. A method for assembling a corrosion resistant Faraday cage as in claim 12, wherein the step of eliminating the coating from the contact points comprises mechanically reducing the contact point to expose bare metal casting material.

14. A method for assembling a corrosion resistant Faraday cage as in claim 12, wherein the step of eliminating the coating from the contact points comprises chemically reducing the contact point to expose bare metal casting material.

15. A method for assembling a corrosion resistant Faraday cage as in claim 11, further comprising the step of:
utilizing the track to hold an adhesive material used for securing the cover into a fixed position.

16. A method for assembling a corrosion resistant Faraday cage as in claim 11, further comprising the step of:
forming the plurality of serrated contact points into a truncated shape.

17. A method for assembling a corrosion resistant Faraday cage as in claim 11, further comprising the step of:
repeating the plurality of serrated contact points in a periodic manner on the fence.

\* \* \* \* \*